United States Patent
Suzuki et al.

[11] Patent Number: 5,834,730
[45] Date of Patent: Nov. 10, 1998

[54] PLASMA PROCESSING EQUIPMENT AND GAS DISCHARGING DEVICE

[75] Inventors: Setsu Suzuki; Noboru Tokumasu; Kazuo Maeda; Junichi Aoki, all of Tokyo, Japan

[73] Assignees: Canon Sales Co., Inc.; Semiconductor Process Laboratory Co., Ltd., both of Japan

[21] Appl. No.: 792,138

[22] Filed: Jan. 31, 1997

[30] Foreign Application Priority Data

Feb. 1, 1996 [JP] Japan ................................. 8-016502
Feb. 1, 1996 [JP] Japan ................................. 8-016503

[51] Int. Cl.$^6$ ................................................. B23K 10/00
[52] U.S. Cl. ........................... 219/121.43; 219/121.51; 219/121.4; 156/345; 118/723 R
[58] Field of Search ................... 219/121.43, 121.4, 219/121.44; 204/192.35, 298.31, 298.34, 298.32; 156/345; 118/723 R

[56] References Cited

U.S. PATENT DOCUMENTS

| | | | |
|---|---|---|---|
| 4,750,980 | 6/1988 | Hynecek | 204/192.34 |
| 5,091,217 | 2/1992 | Hey et al. | 427/248.1 |
| 5,647,945 | 7/1997 | Matuse et al. | 156/345 |
| 5,695,564 | 12/1997 | Imahashi | 118/719 |
| 5,698,062 | 12/1997 | Sakamoto et al. | 156/345 |

*Primary Examiner*—Mark H. Paschall
*Attorney, Agent, or Firm*—Lorusso & Loud

[57] ABSTRACT

A gas discharging device is provided which has a function as one of opposing electrodes to plasmanize a reaction gas and executes film formation and etching with a plasma gas. The device comprises a base body having a recess portion at its central portion and a through-hole for introducing a gas into the recess portion, a gas distributing plate provided in the recess portion for introducing the gas in a radial direction, and an annular gas discharging member for discharging the gas introduced by the gas distributing plate.

23 Claims, 11 Drawing Sheets

(a)

(b)

PLASMA PROCESSING EQUIPMENT AND GAS DISCHARGING DEVICE

BACKGROUND OF THE INVENTION

1. Field of the Invention

The present invention relates to a plasma processing equipment and a gas discharging device and, more particularly, a plasma processing equipment for executing film formation or etching with plasma gas and a gas discharging device having an electrode for applying high frequency power to plasmanize reaction gas.

2. Description of the Prior Art

For film formation by the CVD method on a mass production scale in the prior art, 1) multichamber type CVD equipment,
2) walking beam type CVD equipment for continuous processing, and
3) multireactor type CVD equipment for batch processing, are used selectively.

As shown in FIG. 1, in the multichamber type CVD equipment, because process chambers 3a to 3f are provided independently, various different processes can be executed to enhance flexibility of the equipment. Furthermore, the plasma CVD equipment may be accomplished by providing respective process chambers 3a to 3f with plasma generating equipments.

In FIG. 1, a reference 1 denotes a load lock chamber; 2, a robot installed in the load lock chamber 1; and 4, a robot for loading/unloading the wafers 6a to 6f into/from respective process chambers 3a to 3f.

As shown in FIG. 2, in the walking beam type CVD equipment, a wafer loading table 12 in which a plurality of wafer loading portions 13a to 13h are aligned around a rotation axis is provided in a single process chamber 11. There are provided a plurality of walking beams 14a to 14h which can lift the wafers 15a to 15h up from the wafer loading table 12 by vacuum chuck or the like before and after processing of the wafers, and then, in the state of holding them as it is, can rotate around the rotation axis to carry them to next wafer loading portions 13a to 13h. Respective wafer loading portions 13a to 13h are equipped with heaters (not shown).

In FIG. 2, a reference 7 denotes a first load lock chamber; 8, a robot installed in the first load lock chamber 7; 10, a second load lock chamber; 9a, a valve for opening and closing a path between the first load lock chamber 7 and the second load lock chamber 10; and 9b, a valve for opening and closing a path between the second load lock chamber 10 and the process chamber 11.

By rotating and shifting the wafers 15a to 15h sequentially with the use of the walking beams 14a to 14h, continuous film formation can be attained with higher throughput. If the film forming portions are separated to a plurality of reactors and films formed by respective reactors are piled up, then difference in thickness and quality of the films between the wafers 15a to 15h can be eliminated.

As shown in FIGS. 3A and 3B, in the multireactor type CVD equipment for batch processing, a plurality of wafer loading portions 22a to 22d acting as electrodes for plasmanizing the reaction gas are provided separately in the wafer loading table 21 in the single process chamber. Electrodes 23a to 23d with shower heads for supplying the reaction gas and the high frequency power to the wafer loading portions 22a to 22d individually are provided over the wafer loading portions 22a to 22d on a one-by-one correspondence. The wafer loading table 21 is fixed whereas there is provided a robot (not shown) by which respective wafers 26a to 26d set on the wafer loading portions 22a to 22d are lifted before and after film formation and then shifted on the wafer loading portions 22a to 22d sequentially.

In the multireactor type batch-processing CVD equipment, after the wafers 26a to 26d are loaded respectively on a plurality of wafer loading portions 22a to 22d, film forming process is carried out as a batch process. The wafers 26a to 26d being loaded on the wafer loading portions 22a to 22d are lifted by a robot (not shown) every film formation and then shifted on the wafer loading portions 22a to 22d in sequence.

At this time, different kinds of multi-layered films can be continuously formed by supplying different kinds of reaction gases to the electrodes 23a to 23d with shower heads respectively.

If the same process is to be carried out as a batch process, throughput can be improved proportionally to the number of the wafers 26a to 26d to be batch-processed.

Of the above three kinds of CVD equipments, the multireactor type batch-processing CVD equipment can achieve highest throughput.

However, in the multichamber type CVD equipment, the robot 4 must take action to unload the wafers 6a to 6f from the first chamber 3a and then load them on the second chamber 3b, for example. Therefore, a lot of time is needed to carry the wafers 6a to 6f so that high throughput which is in proportion to the number of process chambers 3a to 3f cannot be attained.

A vacuum pumping system and a gas supply system are required for individual process chambers. Still more, since reaction gas supply systems and high frequency power supply systems must be provided to respective reactors individually, inherent difference in supply amount of reaction gas and high frequency power remains between these reactors. As a result, it is likely that different thickness and quality of the films may be brought out among the wafers 6a to 6f.

If the multichamber type CVD equipment is used as the plasma CVD equipment, a high frequency power supply for excitation, etc. must be equipped. Another problem arises that the equipment is increased in size.

In turn, in the walking beam type continuous-processing CVD equipment, because merely a single process chamber 11 is employed, the reaction gas and the high frequency power cannot be separated between respective reactors. For this reason, different kinds of multi-layered films cannot be continuously formed.

In addition, since the wafers 15a to 15h are lifted over the loading table 12 at the time of shifting the wafers 15a to 15h from one film formation process to another, temperature of the wafers 15a to 15h declines inevitably. Thereby, there is caused another problem that, since the wafers 15a to 15h are subject to heat cycle before formation of entire layers is completed, distortion remains in the film.

Moreover, film forming process must be interrupted during shifting the wafers 15a to 15h, then the wafers 15a to 15h must be heated up to a predetermined temperature again after shifting, and then succeeding process must be waited until flow rate of gas is stabilized. These operations consume much process time. As a result, still another problem occurs that high throughput cannot be assured.

Next, the multireactor type batch-processing CVD equipment has problems similar to those of the walking beam type continuous-processing CVD equipment since the wafers 26a to 26d are shifted on the wafer loading portions 22a to 22d successively.

Still further, since reaction gas supply systems and high frequency power supply systems are provided to respective reactors individually, inherent difference in supply amount of reaction gas and high frequency power remains between these reactors. Consequently, different thickness and quality of the films would be brought out among the wafers 6a to 6f.

Above problems similarly arise in etching equipments which have similar structures to the above to use plasma gas. It is expected to overcome such problems.

In the meanwhile, a gas discharging device used in the plasma enhanced CVD or etching equipments of those equipments, though not shown in detail, has a conductive base body with a through-hole for introducing a gas at the center thereof and a conductive gas discharging member for discharging the introduced gas. A contact therebetween is made in the periphery of the base body. And the gas discharging device acts as one of opposing electrodes for plasmanizing a reaction gas, and a high frequency power supply is connected to the base body to supply a power with a high frequency.

In the above gas discharging device, when high frequency power is supplied to the gas discharging device, it is applied to the gas discharging member via the base body and the peripheral portion of the gas discharging device. However, potential drop is caused in the gas discharging member due to impedance of the gas discharging member per se against high frequency power. Therefore, if location approaches closer to the central portion of the gas discharging member, then larger difference in potential is caused between the base body and the gas discharging member. For this reason, in some cases there is caused such a problem that electric discharge may occur between the base body and the gas discharging member according to the magnitude of high frequency power.

SUMMARY OF THE INVENTION

It is an object of the present invention to provide a plasma processing equipment capable of forming films and/or different kinds of multilayered films with uniform thickness and homogeneous quality or executing uniform etching by moving a plurality of substrates.

It is another object of the present invention to provide a plasma processing equipment capable of forming films with uniform thickness and homogeneous quality while attaining a high through-put and preventing increase in size of the equipment.

It is still another object of the present invention to provide a gas discharging device capable of discharging a reaction gas uniformly on a plurality of substrates being positioned in an annular fashion to oppose to reaction gas discharging portions, and suppressing unnecessary electrical discharge therein.

It is still another object of the present invention to provide a gas discharging device capable of suppressing unnecessary electrical discharge therein.

In the plasma processing equipment of the present invention, a loading table for loading a plurality of substrates thereon can be provided rotatably relative to the gas discharging device.

Therefore, even if gas supply from the gas discharging device is deviated locally, or even if gas flow is deviated because of structural asymmetry of the gas discharging device, supply of the reaction gas to the substrates can be made uniform by rotating the gas discharging device along one direction or both directions during forming or etching the film. The film with uniform thickness and homogeneous quality can thus be formed on a plurality of substrates, or the equal etching can be performed.

Then, by forming both an electrode (first electrode) serving as the gas discharging device and an electrode (second electrode) serving as the loading table as a single electrode respectively, only one high frequency power supply may be used in the equipment. In addition, by forming a heater in the loading table as a single heater, only one power supply may be used to supply power to the heater in the equipment. Thus, increase in size of the equipment can be suppressed.

Further, when a reaction gas is plasmanized upon applying a high frequency power between the first electrode and the second electrode, a strength of the generated plasma is easy to be locally different because entire wide area of the loading table on which a plurality of substrates are loaded acts as a single electrode. Even in this case, the rotation of the loading table relative to the gas discharging device makes the plasma strength to all substrates uniform to result in formation of films with uniform thickness and homogeneous quality.

Meanwhile, in the event that the substrates are arranged along a circumference of the loading table and a single gas discharging device is utilized, the reaction gas is to be discharged out of center of the substrate when the gas is discharged from the center of the circumference. Hence, while reaction gas spreads from the central portion of the loading table to the peripheral portion, deviation in a gas supply amount may readily occur along the radial direction of the loading table. In such a case, it is likely that variation in gas supply amount occurs on one surface of the substrates.

In the another plasma processing equipment of the present invention, a single gas discharging device wherein a gas introducing port is provided in a central portion is used, and a gas discharging portion is formed in an annular region so as to oppose to a plurality of substrates. Hence, because the reaction gas is discharged from the gas discharging member positioned substantially directly over the substrates, the reaction gas can be discharged to respective center areas of the substrates, so that gas supply amount to respective substrates can be made uniform. Further, the discharge of the reaction gas just above the center of the substrate results in an isotropic spread to the periphery of the substrate from the center. This leads to a suppression of the deviation in supply on the surface of the substrate.

In addition, a narrow gas flow path for connecting the gas discharging portion with the gas introducing port is provided in the gas discharging device. Therefore, since the reaction gas is then fed from the gas introducing port to the gas discharging portion via the narrow gas flow path, etc., it can be sent from the gas introducing port to the gas discharging portions without unnecessary spreading. Therefore, supply of the reaction gas to the gas discharging portion can be equalized. For this reason, a supply amount of the reaction gas to respective substrates can be made uniform much more.

In addition, since the loading table is equipped with a heater, the loading table can be rotated and shifted while heating the substrates. Thereby, the substrates can be shifted with keeping temperature of the substrates at a predetermined temperature.

Further, in case plural heaters are provided to plural loading portions of the loading table separately, uniformity of the temperature of the substrates placed on respective loading portions can be achieved by adjusting respective calorific values of respective heaters even when thermal conductivities in respective substrate loading portions become different and calorific values generated by heaters become different.

With the facts described above, films with uniform thickness and homogeneous quality can be formed, or films can be uniformly etched.

Furthermore, if the substrates are shifted and the reaction gases are switched simultaneously while keeping the temperature of the substrates at a predetermined temperature after formation or etching of one film has been finished, different kinds of films can be formed continuously, or different kinds of films can be etched continuously. Thus, higher throughput can be accomplished, while different kinds of films with uniform thichness and homogeneous quality can be formed, or different kinds of films can be etched uniformly.

Still further, since the loading table may be rotated and shifted while continuing the heating of the substrates, no readjustment for the temperature of the substrates is required once temperature of the substrates has be established. Since a supply amount of the reaction gas to the substrates is made even, there is no necessity of readjustment for gas flow rate, etc. before and after the substrates are shifted once gas flow rate, etc. have been set. As a result, film forming conditions such as temperature, gas flow rate, etc. are in no means varied according to respective locations until film formation has been completed, thereby improving precision in film forming conditions.

A plurality of gas discharging portions are connected to a plurality of separated gas introducing ports respectively. Therefore, even if length, inner diameter, etc. of the gas flow paths in the gas discharging device are different locally because of variation in manufacturing the gas discharging device, it becomes feasible to make discharge amounts of the reaction gases from respective gas discharging portions uniform by individually adjusting a flow amount of the reaction gas introduced from respective gas introducing ports. Thus, films with uniform thickness and homogeneous quality can be formed, or films can be uniformly etched.

A conductive gas piping for connecting the gas discharging device and the gas introducing port and having a coil-like partial gas piping is provided. The coil-like gas piping has a function as a coil for cutting off conduction of high frequency components of the power. Hence, even if the insulating material is not interposed between the gas introducing port and the high frequency power supply as a part of the gas piping, the high frequency power can be prevented from passing through to the gas introducing port side when high frequency power is supplied from the high frequency power supply which is connected downstream rather than the coil-like gas piping.

Moreover, since a rotation axis to which the loading table is to be fixed is supported rotatably at an outside of a process chamber, dust due to wear of the supporting portion caused by rotation can be prevented from being generated in the equipment.

In the gas discharging device of the present invention, there are provided a second gas flow path for splitting the gas introduced into a central portion of the gas discharging device by a first gas flow path in a radial direction at the central portion and then resplitting the gas toward the central portion and an peripheral portion of the gas discharging device in the radial direction in an intermediate position between the central portion and the peripheral portion, and a plurality of gas discharging holes arranged in an annular region around the central portion for discharging the resplit gas. For instance, the second gas flow path is made up of a gas distributing plate for introducing in a radial direction the gas which being introduced from a through hole (first gas flow path) formed in the base body, and an annular gas discharging member for discharging the gas.

Accordingly, since the gas passed through the first gas flow path is then fed to the gas discharging holes through the second gas flow path, the gas can be sent from the first gas flow path to the gas discharging holes not to spread unnecessarily. Therefore, supply of the gas to the gas discharging holes can be equalized. In addition, since the gas distributing plate is provided to spread the gas supplied from the first gas flow path in the radial direction, the gas in a widely spread state previously can be discharged. As a result, a gas amount supplied to a peripheral portion can be made uniform rather than the case where the gas is discharged directly from the first gas flow path.

Then, in the plasma processing equipment of the present invention, there are provided the gas discharging device described above, and a loading table for loading a plurality of substrates to oppose to the gas discharging member which is formed in an annular region. Hence, the gas is discharged from the gas discharging member positioned substantially directly over the substrates, so that the reaction gas can be discharged to respective center areas of the substrates, whereby equalizing gas supply amount to respective substrates. Thereby, a film with uniform thickness and homogeneous quality can be formed on a plurality of substrates.

Further, even if gas supply from the gas discharging devicei s deviated locally, or even if gas flow is deviated because of structural asymmetry of the gas discharging device, supply of the reaction gas can be made uniform by rotating the gas discharging device along the annular region in the course of forming the film. The film with uniform thickness and homogeneous quality can thus be formed on plural substrats.

Still further, in the event that the gas discharging device is also used as one of the opposite electrodes in the plasma processing equipment, when the high frequency power supply to plasmanize the gas is connected to the base body to supply high frequency power under the condition where the base body of the gas discharging device is made contact to the gas discharging member at not only a peripheral portion (an outer peripheral portion) but also a central portion (an inner peripheral portion) of the base body, potential difference between the base body and the gas discharging member can be reduced much more rather than the case where the base body in the gas discharging device is made contact to the gas discharging member only at the peripheral portion of the base body. Therefore, electric discharge between the base body and the gas discharging member can be prevented.

Furthermore, if an AC power supply for applying a bias voltage to the substrates is connected to an electrode of the loading table, then active particles (ions) can be collected by virtue of attractive force generated by an electric field. Consequently, film forming rate and etching rate can be enhanced and also a more densified film can be fabricated.

Moreover, if an electrode (first electrode) serving as the gas discharging device and an electrode (second electrode) serving as the loading table are formed as a single electrode respectively, only one high frequency power supply may be used. In addition, by forming a heater to be formed in the loading table as a single heater, only one power supply may be used to supply power to the heater. Correspondingly, increase in size of the equipment can be suppressed.

Other and further objects and features of the present invention will become obvious upon an understanding of the

DESCRIPTION OF THE PREFERRED EMBODIMENTS

Figure 1:
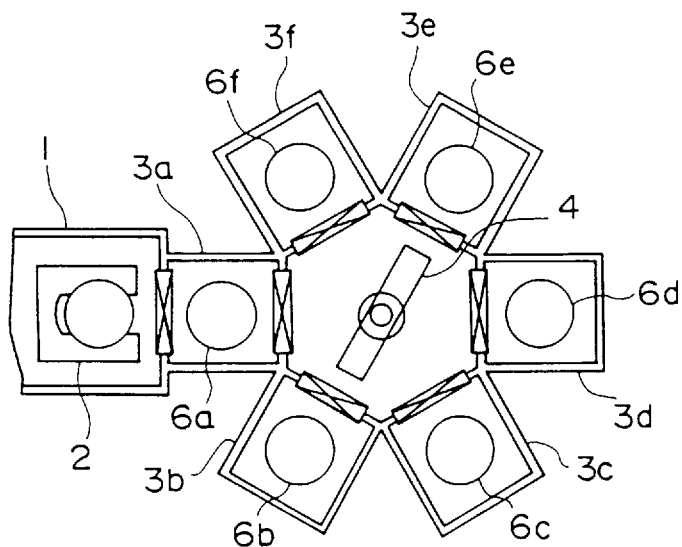
FIG. 1 is a plan view showing an allover structure of a multichamber type CVD equipment in the prior art.
Figure 2:
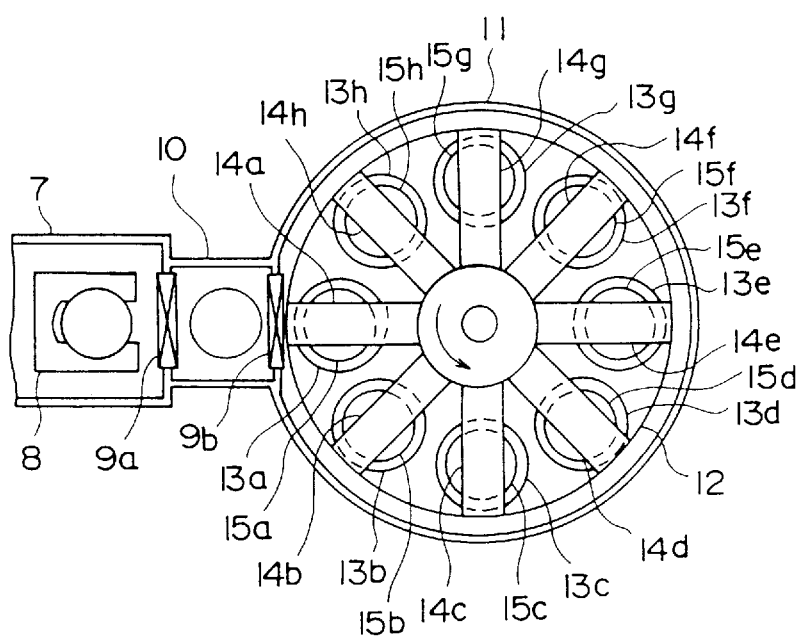
FIG. 2 is a plan view showing an allover structure of a walking beam type CVD equipment in the prior art.
Figure 3A:
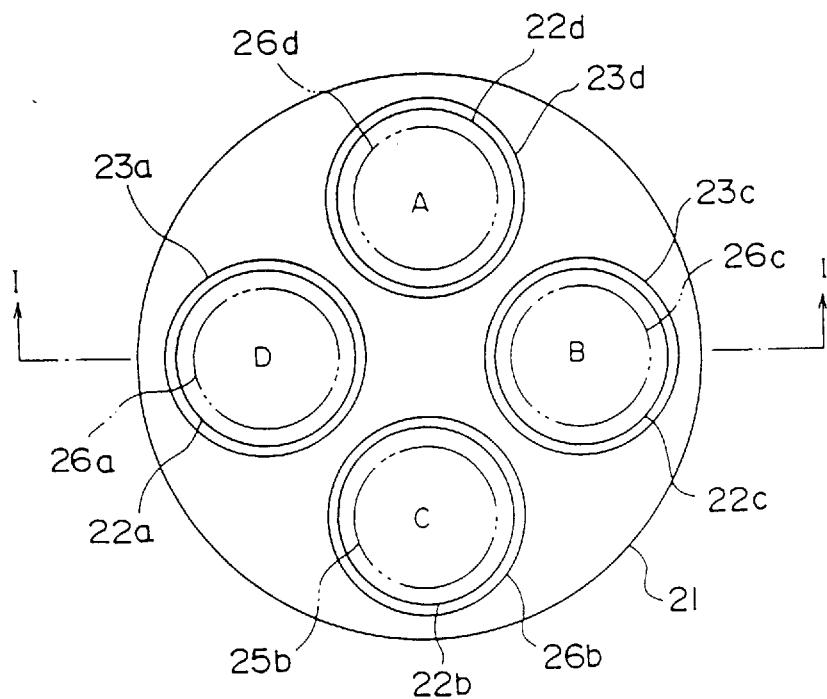
FIG. 3A is a plan view showing an allover structure of a multireactor type CVD equipment in the prior art.
Figure 3B:
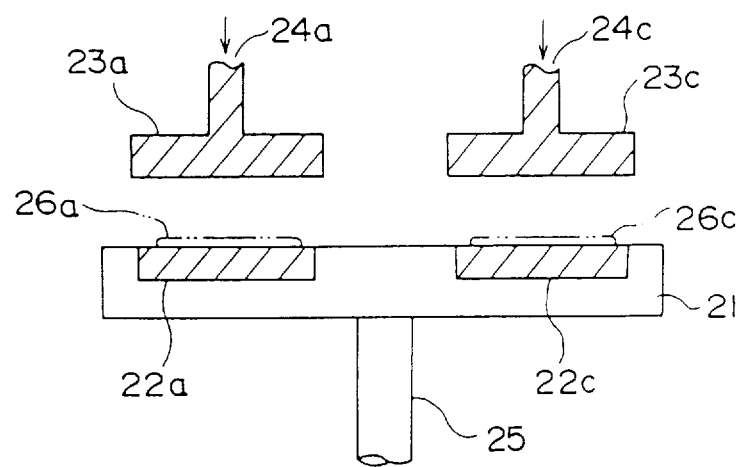
FIG. 3B is a sectional view showing the multireactor type CVD equipment taken along a line I—I.

Various embodiments of the present invention will be described with reference to the accompanying drawings. It should be noted that the same or similar reference numerals are applied to the same or similar parts and elements throughout the drawings, and the description of the same or similar parts and elements will be omitted or simplified.

First Embodiment

Figure 4:
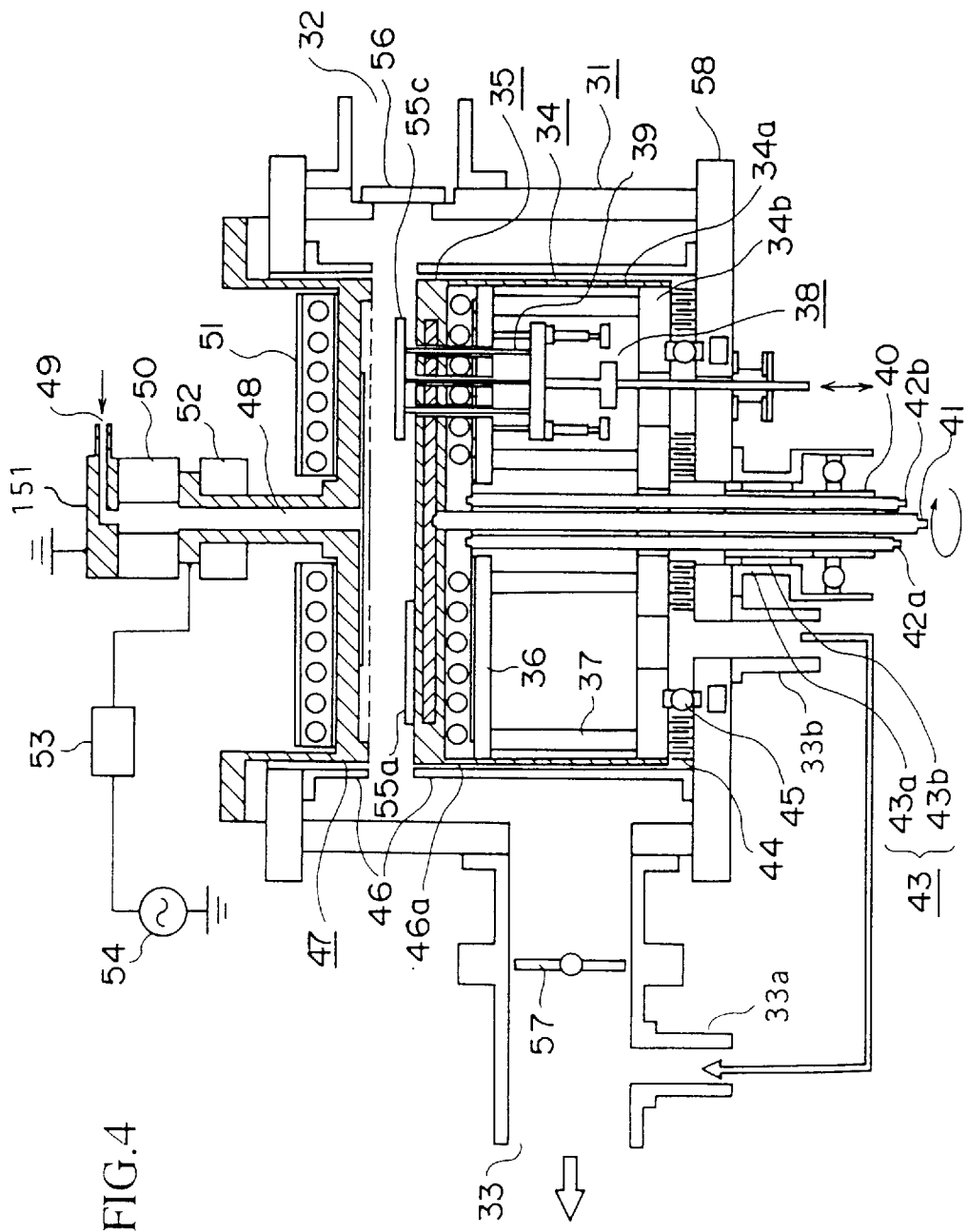
FIG. 4 is a side view showing an allover structure of a plasma CVD equipment according to a first embodiment of the present invention.

FIG. 4 is a side view showing an entire structure of a plasma CVD equipment according to a first embodiment of the present invention.

In FIG. 4, a reference 31 denotes a single process chamber, and a reference 32 denotes a loading/unloading port used for loading and unloading a wafer (substrate) into and from the process chamber 31. A valve 56 for opening and closing the loading/unloading port 32 is provided. References 33, 33a, 33b are exhaust ports to which an exhausting apparatus (not shown) is connected. An interior of the process chamber 31 is exhausted via the exhaust ports 33, 33a, 33b to be reduced up to a predetermined pressure.

In addition, a rotatable retainer 34 to which a wafer loading table 35 is fixed, and a gas discharging device 47 which opposes to a wafer loading surface of the loading table 35 are provided in the process chamber 31.

The gas discharging device 47 has a gas introducing port 49 for introducing a reaction gas, and gas discharging holes for discharging the reaction gas, which being connected with each other via a gas flow path. A gas piping is connected to the gas introducing port of the gas discharging device 47, while the gas introducing port 49 of the gas piping 151 is connected to a gas introducing port of the gas discharging device 47 via a gas flow path (a through-hole) 48 made of the gas piping. A part of the gas piping is made of an insulator 50 and remaining thereof is made of conductive material.

Figure 7:
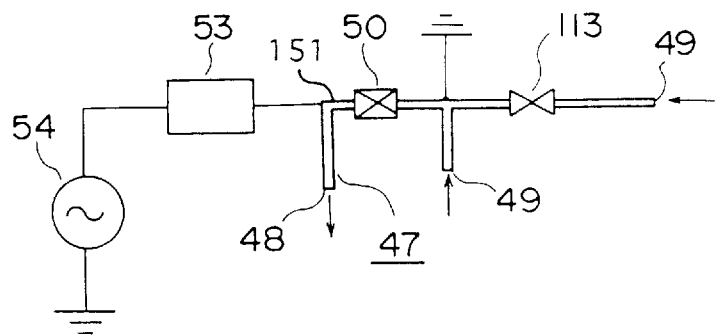
FIG. 7 is a side view showing gas pipings of the gas discharging device in the plasma CVD equipment according to the first embodiment of the present invention in detail.

In addition, the gas discharging device 47 has a function as one electrode (first electrode) of opposing electrodes to plasmanize the reaction gas and is formed of conductor. A high frequency power supply 54 for plasmanizing the reaction gas is connected via a matching circuit 53 to a conductive gas piping connected to the gas discharging device 47. A frequency of the high frequency power supply 54 is set to 13.56 MHz. As the frequency of the high frequency power supply 54, 100 kHz and other frequency may be selected as the case may be. The conductive gas piping on the gas introducing port 49 side is grounded. An equivalent circuit of this portion is shown in FIG. 7. The reason why the gas piping 151 is grounded is that a person who touches a gas bomb, etc. connected to the gas piping 151 can be prevented from receiving an electric shock. The reason why a part of the gas piping 151 is made of the insulator 50 is that, if the gas piping 151 is as a whole made of conductor, the high frequency power supplied to the gas discharging device 47 serving as the electrode would be connected, to the gas introducing port 49 of the gas piping.

The rotatable retainer 34 is made of a loading table 35, a side wall 34a, a bottom wall 34b, and a rotation axis 40. The rotatable retainer 34 is rotated upon the rotation axis 40 in one direction or both directions during film formation.

A heater 51 is provided on an opposite surface to a gas discharging surface of the gas discharging device 47. The reason for this is put forth in the following. In other words, reaction product is generated by the reaction gas which is discharged from the gas discharging device 47 and then adheres to the gas discharging device 47. Since the reaction product is soft as it is, it easily comes off the gas discharging device 47 to thus become particles. In order to make it difficult that the particles are peeled off, the adhesion is improved and the reaction product is made hard by heating the gas discharging device 47 up to about 200° C.

Figure 5A:
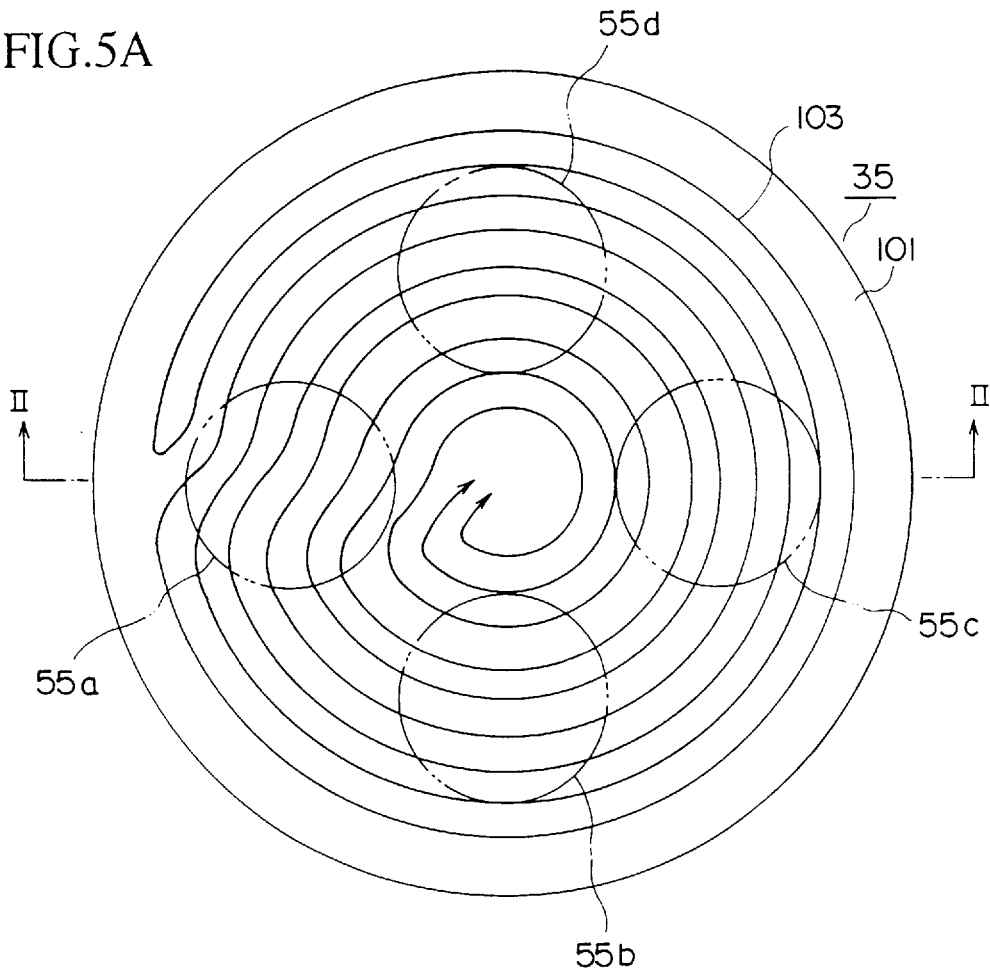
FIG. 5A is a plan view showing a wafer loading table in the plasma CVD equipment according to the first embodiment of the present invention in detail.
Figure 5B:
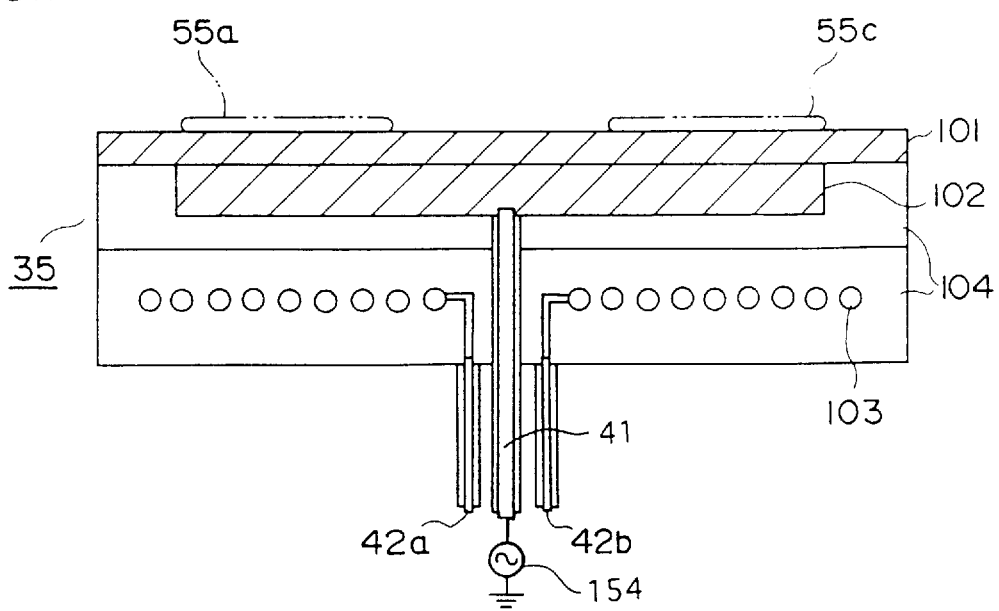
FIG. 5B is a sectional view showing the wafer loading table taken along a line II—II in FIG. 5A.

Details of the wafer loading table 35 are illustrated in FIGS. 5A and 5B. FIG. 5A is a plan view showing the wafer loading table 35 in the plasma CVD equipment according to the first embodiment of the present invention in detail. FIG. 5B is a sectional view showing the wafer loading table 35 taken along a line II—II in FIG. 5A. Referring to FIGS. 5A and 5B, a conductive plate 101 made of tantalum or tungsten is set up on a surface of the wafer loading table 35. A second electrode (a conductive plate) 102 made of tantalum or tungsten to plasmanize the reaction gas is buried to contact the conductive plate 101. The second electrode 102 has a function as other electrode (second electrode) of the opposing electrodes. In addition, a heater 103 made of tantalum or tungsten is buried beneath the second electrode 102 in the wafer loading table 35 via an insulator (a base body) 104. The insulator 104 is made of insulating material, e.g., alumina ceramic, which has a thermal expansion coefficient similar to those of tantalum or tungsten, i.e., material of the conductive plate 101, the second electrode 102, and the heater 103.

One end of a wiring 41 is connected to the second electrode 102 while the other end of the wiring 41 is connected to a high frequency power supply 154. A high frequency power with frequency of 380 kHz, for example, is supplied to the second electrode 102 during plasma generation so as to bias wafers 55a to 55d to negative voltage.

One ends of other wirings 42a, 42b are also connected to the heater 103, other ends of which being connected to a DC power supply (not shown). DC power is supplied to the heater 103 to heat the wafers 55a to 55d.

If the wafers 55a to 55d are biased to negative voltage, then film forming rate can be improved. If the wafers 55a to 55d are biased to negative voltage and are heated, then densification of the film formed can be increased.

The wafer loading table 35 will be manufactured as follows. More particularly, the heater 103 is put on a first green sheet made of alumina, then a resultant structure is covered with a second green sheet made of alumina, and then the second electrode 102 is put on a resultant structure. An entire surface including the second electrode 102 is in turn covered with a third green sheet made of alumina, and then the third green sheet on the second electrode 102 is removed to expose the second electrode 102. Subsequently, the conductive plate 101 is formed on the second electrode 102 and the third green sheet in the neighboring area of the second electrode 102, and then the green sheet is hardened by heating. As a result, the wafer loading table 35 in which the second electrode 102 and the heater 103 are buried as one body can be manufactured. Since the second electrode 102 and the heater 103 are buried in one united body in ceramic, strength against thermal stress caused by difference in thermal expansion coefficient can be enhanced. Therefore, crack of the ceramic because of heating by the heater 103 can be suppressed.

In case the wirings 41, 42a, 42b are directly connected to the high frequency power supply and the DC power supply, rotation of the wafer loading table 35 causes the wirings 41, 42a, 42b to be twisted. However, if the wafer loading table 35 is rotated in the opposite direction by the same number of rotation as previous one, then such twist of the wirings 41, 42a, 42b can be restored or prevented. Otherwise, if the high frequency power supply, the DC power supply and the wirings 41, 42a, 42b are connected via contacts (rotary connectors) which are provided on both the power supply side and the rotation axis 40 side, such twist of the wirings 41, 42a, 42b can be prevented even if the wafer loading table 35 is rotated in one way.

Besides, though the second electrode 102 is buried in the wafer loading table 35 to rotate together, the second electrode may be separated from the wafer loading table. In this case, the second electrode is fixed, and the wafer loading table rotates.

As shown in FIG. 4, a wafer lifter 38 is provided below the wafer loading table 35 so as to load and unload the wafer 55c to and from the wafer loading table 35. Through-holes into which wafer lift pins 39 are inserted are formed in the wafer loading table 35. If the wafer lift pins 39 are lifted up via the through-holes by pushing up the wafer lifter 38, then the wafer 55c is pushed up to be removed from the wafer loading table 35.

In order to seal up a clearance formed between the rotation axis 40 and the equipment, iron powder grease 43b for fluid magnetic shielding 43 is filled up in the clearance at the lower end of the wafer loading table 35. Since temperature of the wafer loading table 35 is raised by heating, it is likely that iron powder grease 43b for fluid magnetic shielding 43 is deteriorated by heating. In order to avoid such deterioration, heat transfer to the lower side of the equipment must be suppressed to the utmost. Therefore, to prevent heat transfer and suppress heat radiation, the wafer loading table 35 is supported by narrow supporting bars 37 made of stainless steel at several points via the insulator 36 and is positioned as far from the bottom of the equipment as possible. Consequently, air just exists between the wafer loading table 35 and the bottom of the equipment except for the narrow supporting bars.

The fluid magnetic shielding 43 is made up of a magnet 43a and the iron powder grease 43b. For instance, as shown in FIG. 4, in order to seal up the clearance between the rotation axis 40 and the base 58 of the equipment, the iron powder grease 43b is filled up in the clearance and then the base 58 is formed as the magnet 43a not to move the iron powder grease 43b, so that shielding of the process chamber 31 is maintained.

A through-hole is formed in the central area of the bottom wall 34b so as to extend the wirings 41, 42a, 42b therethrough. The rotation axis 40 which has a larger diameter than that of the through-hole is attached to the bottom wall 34b around the through-hole, and the wirings 41, 42a, 42b extend from the loading table 35 via the through-hole and the inside of the rotation axis 40.

The rotatable retainer 34 is held by a ball bearing 45 at a predetermined distance from the base 58 of the equipment. A plurality of upright shielding plates 44 are formed like concentric circles respectively on a lower surface of the bottom wall 34b of the rotatable retainer 34 and an upper surface of the base 58. If the upper and lower shielding plates 44 are engaged with each other like a comb, the rotatable retainer 34 can be rotated. Clearances formed between the shielding plates 44 are narrow. The clearances are formed to have sectional shapes which are folded over and over again like winding. For this reason, since conductance of the clearances is small, the unnecessary reaction gas is hard to flow through the clearances even after the reaction gas is supplied to the wafers 55a to 55d. The clearance can also suppress flow of particles which are generated by reaction of the reaction gas therethrough.

As a result, the reaction product can be prevented from adhering to the ball bearing 45 which is positioned downstream from the shielding plates 44 and between the bottom wall 34b of the rotatable retainer 34 and the base 58 of the equipment. Contamination of the iron powder grease 43b, etc. by the particles can also be suppressed. The reaction gas, though escaped slightly through the clearances, can be exhausted from an exhaust port 33 via exhaust ports 33b, 33a formed in the base 58 of the equipment. Though not shown, the exhaust ports 33b, 33a are connected through a gas piping.

In order to prevent electric discharge from side walls of the gas discharging device 47 and the rotatable retainer 34, a dark shielding 46 is provided on the side walls of the gas discharging device 47 and the rotatable retainer 34 at a minute distance from those side walls.

Figure 6A:
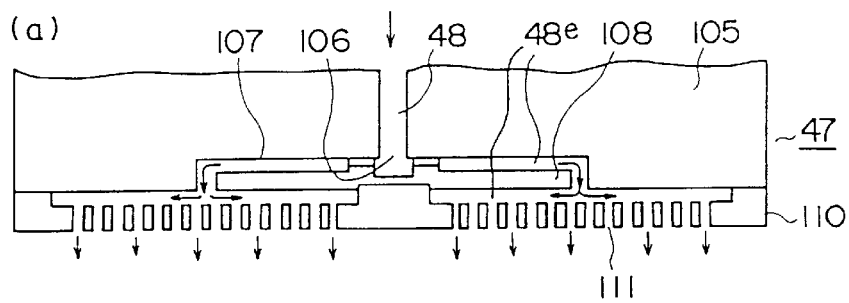
FIG. 6A is a sectional view showing a gas discharging device in the plasma CVD equipment according to the first embodiment of the present invention in detail.
Figure 6B:
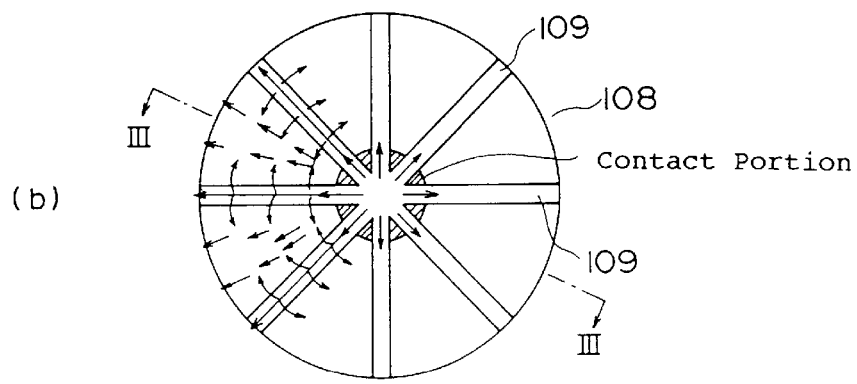
FIG. 6B is a plan view showing a distributing plate in FIG. 6A, where a sectional shape of the distributing plate in FIG. 6A corresponds to that viewed from a line III—III in FIG. 6B.
Figure 6C:
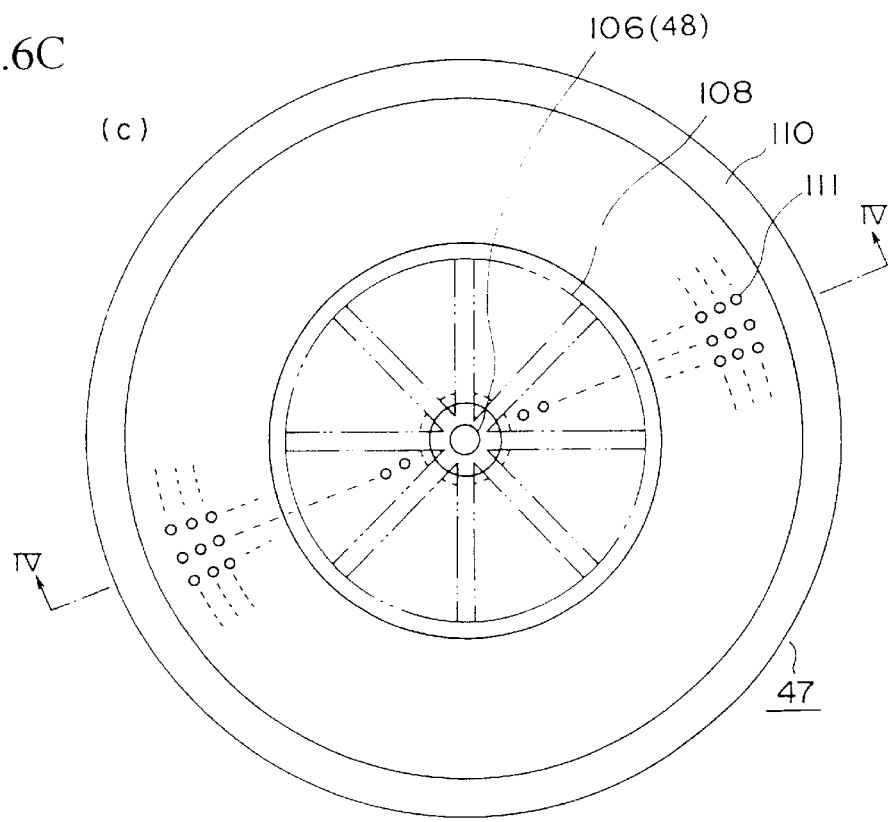
FIG. 6C is a bottom view showing the gas discharging device in FIG. 6A, where a sectional shape in FIG. 6A corresponds to that viewed from a line IV—IV in FIG. 6C.

Next, the gas discharging device 47 will be explained in detail with reference to FIGS. 6A to 6C. FIG. 6A is a sectional view showing the gas discharging device 47. FIG. 6B is a top view showing a distributing plate 108 in FIG. 6A. FIG. 6C is a bottom view showing the gas discharging device 47 in FIG. 6A. A sectional shape of the distributing plate 108 in FIG. 6A corresponds to that viewed from a line III—III in FIG. 6B. A sectional shape in FIG. 6A corresponds to that viewed from a line IV—IV in FIG. 6C.

As shown in FIGS. 6A to 6C, the gas discharging device 47 comprises a base body 105, and a circular conductive gas discharging plate (a gas discharging member) 110 in which a plurality of gas discharging holes 111 are formed in an annular region.

No gas discharging hole 111 is formed in a central region of the gas discharging plate 110. When the gas discharging device 47 is set over the wafer loading table 35, the gas discharging holes 111 are faced to wafers loaded along a circumference of the wafer loading table 35. The gas discharging plate 110 is fixed and connected to the base body 105 at a peripheral portion of the base body 105. A throughhole is formed in a central portion of the base body 105 to serve as a first gas flow path 48. The first gas flow path 48 has a gas blowing port 106 at an end of the base body 105 and is then connected to plural gas discharging holes 111 via second gas flow paths 48e.

The second gas flow paths 48e split in the radial direction the gas which is introduced into the central portion via the first gas flow path 48, and then resplit the gas toward the central portion and an peripheral portion of the base body 105 in the radial direction in a middle of the central region and the peripheral portion. The resplit gas is discharged from the gas discharging holes 111 arranged in an annular region around the central portion.

A particular structure of the second gas flow paths 48e is explained as follows. In other words, a recess portion 107 is formed in a central portion of the base body 105, and a blowing port 106 of the first gas flow path 48 is formed in the recess portion 107. A circular conductive gas distributing plate (gas distributing member) 108 having a size which can be put into the recess portion 107 is provided to the base body 105 around the blowing port 106. Radii of the recess portion 107 and the gas distributing plate 108 may be set such that a circular top end of the gas distributing plate 108 is substantially on a circle depicted by a center of the wafer if rotated on the wafer loading table 35 and that the second gas flow paths 48e is formed between the base body 105 and the gas distributing plate 108. As shown in FIG. 6B, in order to improve gas flow further, a plurality of gas flow grooves 109 are formed on a surface of the gas distributing plate 108 opposing to the blowing port 106 in the radial direction from the central portion.

A space which serves as a second gas flow path 48e is formed between the gas distributing plate 108 and the gas discharging plate. With this, the gas which is introduced by the distributing plate 108 extends again through the second gas flow path 48e to the central portion and the peripheral portion and is dispersed from the gas discharging holes 111.

The gas discharging plate 110 contacts the gas distributing plate 108 at the central portion of the gas discharging plate 110. Accordingly, electric conduction between the base body 105 and the gas discharging plate 110 can be assured both at the central portion and the peripheral portion of the gas discharging plate 110.

Now, in case electric conduction can be assured only between the base body 105 constituting the gas discharging device 47 and the peripheral portion of the gas discharging plate 110, when high frequency power is applied to the gas discharging device 47, potential drop between the base body 105 and the gas discharging plate 110 owing to lead inductance of the gas discharging plate 110 becomes larger at the central portion. Hence, electric discharge occurs between the base body 105 in the central portion of the gas discharging device 47 and the gas discharging plate 110.

At this time, as shown in FIG. 6A, if electric conduction between the base body 105 and the gas discharging plate 110 is given at the central portion as well as the peripheral portion, potential drop between the base body 105 and the gas discharging plate 110 can be made small to thus prevent electric discharge between the base body 105 and the gas discharging plate 110.

As discussed above, according to the first embodiment of the present invention, the wafer loading table 35 for loading a plurality of wafers thereon can be arranged to permit rotation and shift with respect to the gas discharging device 47. For this reason, even if supply of the reaction gas from the gas discharging device 47 is deviated locally, or even if flow of the reaction gas is deviated because of structural asymmetry of the gas discharging device 47, supply of the reaction gas to the wafers can be made even by rotating the wafer loading table 35 along one direction or both directions in the course of forming or etching the film. Therefore, the film with uniform thickness and homogeneous quality can be formed on a plurality of substrates or the film can be etched unifomly.

Then, if both the first electrode serving as the gas discharging device 47 and the second electrode serving as the wafer loading table 35 are formed as a single electrode respectively, only one high frequency power supply 54 may be used to supply high frequency power to the first electrode and the second electrode in the equipment. In addition, if a heater is formed in the wafer loading table 35 as a single heater 103, only one power supply may be used to supply power to the heater 103 in the equipment. Thus, increase in size of the equipment can be suppressed.

Further, when a reaction gas is plasmanized upon applying a high frequency power between the first electrode and the second electrode, a strength of the generated plasma is easy to be locally different because entire wide area of the wafer loading table 35 on which a plurality of wafers 55a to 55d are loaded acts as a single electrode. Even in this case, the rotation of the wafer loading table 35 makes the plasma strength to all wafers 55a to 55d uniform to result in formation of films with uniform thickness and homogeneous quality.

In addition, since the wafer loading table 35 is equipped with the heater 103, the wafer loading table 35 can be rotated and shifted while heating the wafers.

Thereby, the wafers can be shifted with keeping its temperature at a predetermined temperature.

Moreover, the gas discharging holes 111 are provided in the gas discharging device 47 in an annular region to oppose to a plurality of wafers which are arranged along a circumference of the wafer loading table 35. Hence, because the reaction gas is discharged from the gas discharging holes 111 positioned substantially directly over the wafers to oppose to them, the reaction gas can be discharged substantially to respective center areas of the wafers, so that a supply amount of the reaction gas to respective wafers can be made uniform.

In addition, a narrow gas flow path 48, 48e for connecting the annular gas discharging holes 111 with the gas introducing port 49 is provided in the gas discharging device 47. Therefore, since the reaction gas is then fed from the gas introducing port 49 to the gas discharging holes 111 via the narrow gas flow path 48, 48e, it can be sent from the gas introducing port 49 to the gas discharging holes 111 without unnecessary spreading. Therefore, supply of the reaction gas to the gas discharging holes 111 can be equalized. For this reason, a supply amount of the reaction gas to respective wafers can be made uniform much more.

Subsequently, a method of forming the film with the use of the above plasma processing equipment will be explained with reference to FIGS. 8A to 8D. Trimethoxysilane (TMS:SiH(OCH3)3) of alkoxysilane will be used as a silicon containing reaction gas.

Figure 8A:
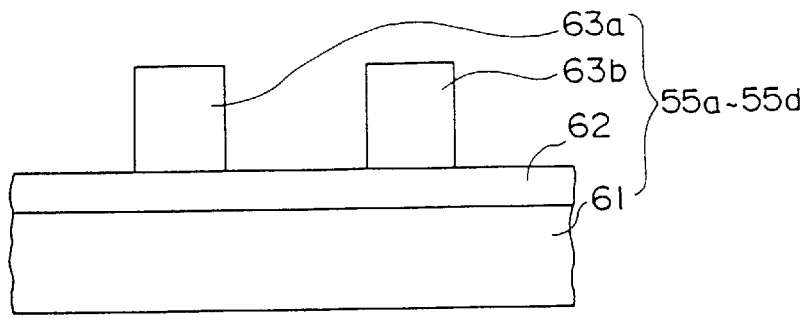
FIGS. 8A to 8D are sectional views showing processes for forming an insulating film by making use of the plasma CVD equipment according to the first embodiment of the present invention in detail.

FIG. 8A is a sectional view showing a state after wiring layers are formed and before a silicon containing insulating film is formed by the plasma CVD method. In FIG. 8A, a reference 61 denotes a silicon substrate; 62, base insulating film made of silicon oxide film formed on the silicon substrate 61; and 63a, 63b, wiring layers formed adjacent to each other at a predetermined interval on the base insulating film 62. Wafers 55a to 55d as substrates to be deposited are formed as described above.

First, an interior of the process chamber 31 is exhausted up to predetermined pressure and held at that pressure.

In turn, the wafers 55a to 55d are loaded into the process chamber 31 and then placed on the wafer loading table 35 supported by the rotatable retainer 34.

Then, the wafers 55a to 55d are heated by the heater 103 and then held at a predetermined temperature.

In the case of this first embodiment, the temperature is set to 300° C. to 400° C. The gas discharging device 47 is heated by the heater 51 up to about 200° C.

Next, by making use of argon gas (carrier gas) at flow rate 100 sccm, liquid trimethoxysilane which being kept at 10° C. is supplied via bubbling to thus generate argon gas containing trimethoxysilane. $N_2O$ gas as oxidizing gas is added to this gas and then the resultant gas is introduced into the process chamber 31 via the gas discharging device 47. At this time, pressure in the process chamber 31 is kept at about 1 Torr.

Subsequently, the rotatable retainer 34 is rotated in both circumferential directions every rotation. This movement is kept at the predetermined period during film formation.

Then, high frequency power with frequency 13.56 MHz and power 2 kW is supplied to the gas discharging device 47 while high frequency power with frequency 380 kHz and power 2 kW is supplied to the second electrode 102 in the wafer loading table 35.

The reaction gas is plasmanized by applying power to the gas discharging device 47, so that $N_2O$ gas is dissociated into active nitrogen N* and active oxygen O* and also silicon containing gas is dissociated into ions including Si—H bonds and electrons. At that time, since high frequency power is being applied to the second electrode 102 in the wafer loading table 35, electrons are accumulated on the wafers 55a to 55d because of difference in mobility between electron and ion. As a result, the wafers 55a to 55d are biased to negative voltage, e.g., 80 to −90 V in this case. Thus, ions in plasmanized reaction gas are drawn to the wafers 55a to 55d to then react with active nitrogen N* and active oxygen O*, so that an $SiO_xN_y$ film 64 begins to stack on the wafers 55a to 55d so as to cover the wiring layers 63a, 63b. Because the wafers 55a to 55d are biased to the negative voltage, an amount of ions reaching to the wafers is enhanced to therefore increase a film forming rate. Since the reaction gas blows off just upon the wafers 55a to 55d, a supply amount of the reaction gas to respective wafers 55a to 55d can be made uniform. Since the wafers 55a to 55d are rotated, supply of the reaction gas to the wafers 55a to 55d can be equalized by rotating the wafer loading table 35 in both circumferential directions during forming the film even if supply of the reaction gas from the gas discharging device 47 is deviated locally, or even if flow of the reaction gas is deviated because of structural asymmetry of the gas discharging device 47. In addition, a supply of plasma energy to the wafers 55a to 55d becomes uniform independent of location because of rotation of the second electrode relative to the first electrode.

Figure 8B:
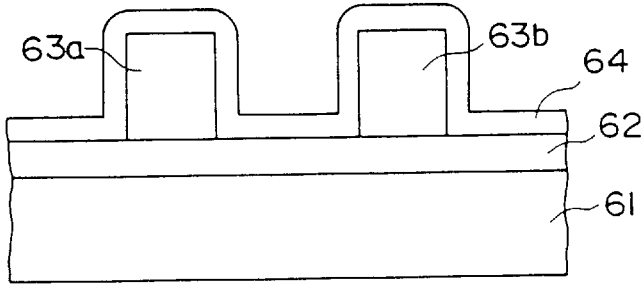

As shown in FIG. 8B, if this condition is kept for a predetermined time period, an $SiO_xN_y$ film 64 of a predetermined thickness can be formed on the wafers 55a to 55d. In this event, because the reaction gas is supplied uniformly to the wafers 55a to 55d, the film having uniform thickness and quality can be formed on a plurality of wafers 55a to 55d.

Figure 8C:
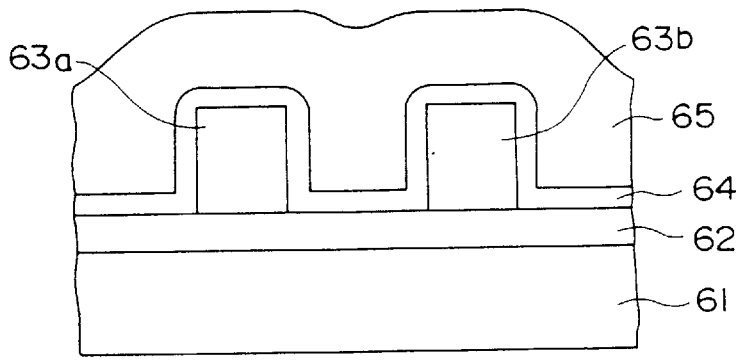

In the next, as shown in FIG. 8C, a silicon oxide film 65 is formed on the $SiO_xN_y$ film 64 by thermal CVD method. In other words, under the conditions that the wafers 55a to 55d are put in normal pressure atmosphere and a wafer temperature is kept at about 400° C., the reaction gas is introduced wherein an $O_3+O_2$ gas including $O_3$ at a density rate of 6% is added to TEOS being carried by the carrier gas. The reaction gas is then thermally dissolved and reacted to stack a silicon oxide film 65 on the $SiO_xN_y$ film 64. At this time, since the underlying $SiO_xN_y$ film 64 has good fitness for the silicon oxide film 65 which is formed by the thermal CVD method using a mixture gas of TEOS+$O_3$, a uniform film forming rate of the silicon oxide film 65 can be achieved. Therefore, abnormal growth can be suppressed and at the same time good step coverage of the silicon oxide film 65 can be attained.

Figure 8D:
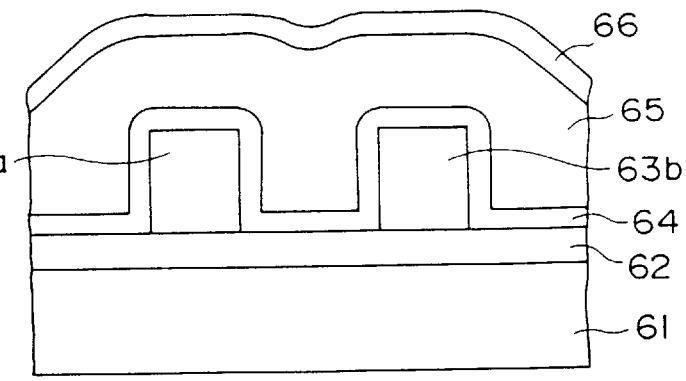

After this, as shown in FIG. 8D, under the similar conditions to that described above, an $SiO_xN_y$ film 66 is formed on the silicon oxide film 65 by the plasma CVD method, whereby finishing a three-layered interlayer insulating film.

With the above, according to the first embodiment of the present invention, since a supply of the reaction gas and plasma energy to respective wafers 55a to 55d can be made uniform in the film forming method by means of the plasma CVD method, the $SiO_xN_y$ films 64, 66 with uniform thickness and quality can be formed on the surfaces of the wafers 55a to 55d.

Still further, because of bias and heating of the wafers 55a to 55d, the formed $SiO_xN_y$ films 64, 66 are much more densified.

Besides, though a plasma processing equipment according to the present invention is used as a film forming equipment in the above embodiment, it may be used as an plasma etching equipment by changing the gases for forming the film to gases for etching a film and adjusting conditions for generating plasma to fit the etching process.

Figure 9A:
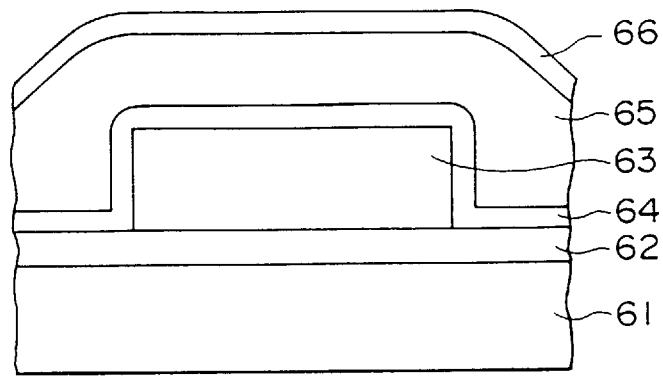
FIG. 9A and FIG. 9B are sectional views showing processes for etching insulating films using plasma enhanced etching equipment according to a first embodiment of the present invention.
Figure 9B:
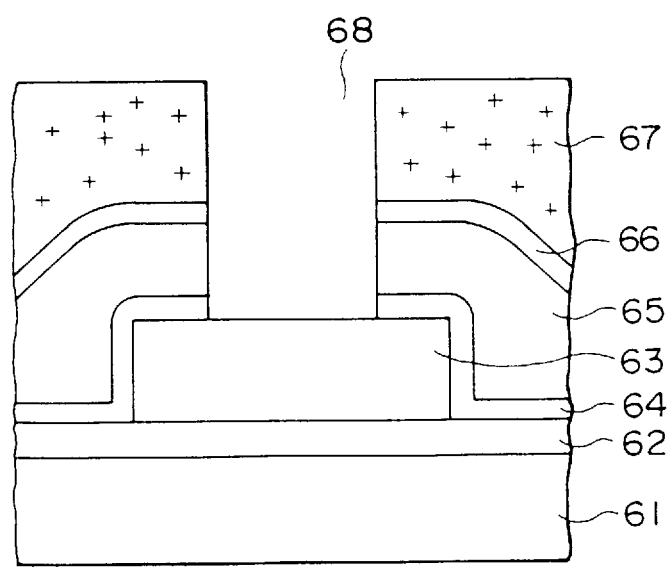

In FIG. 9A and FIG. 9B is shown an example that the $SiO_xN_y$ film 64, the silicon oxide film 65 and the $SiO_xN_y$ film 66 are etched to form a via hole. In FIGS. 9A and 9B, substances shown by same references as those in FIG. 8A through FIG. 8D are corresponding to those in FIG. 8A through FIG. 8D. Another reference 67 indicates a resist mask. A mixed gas of CF4+H2 is used as an etching gas.

In this case, since those films are similar in property, those films can be etched at a time with the same etching gas.

When a multi-layer made of different films is intended to be etched, those films can be sequentialy etched by changing an etching gas according to respective sorts of films.

Second Embodiment

Figure 10:
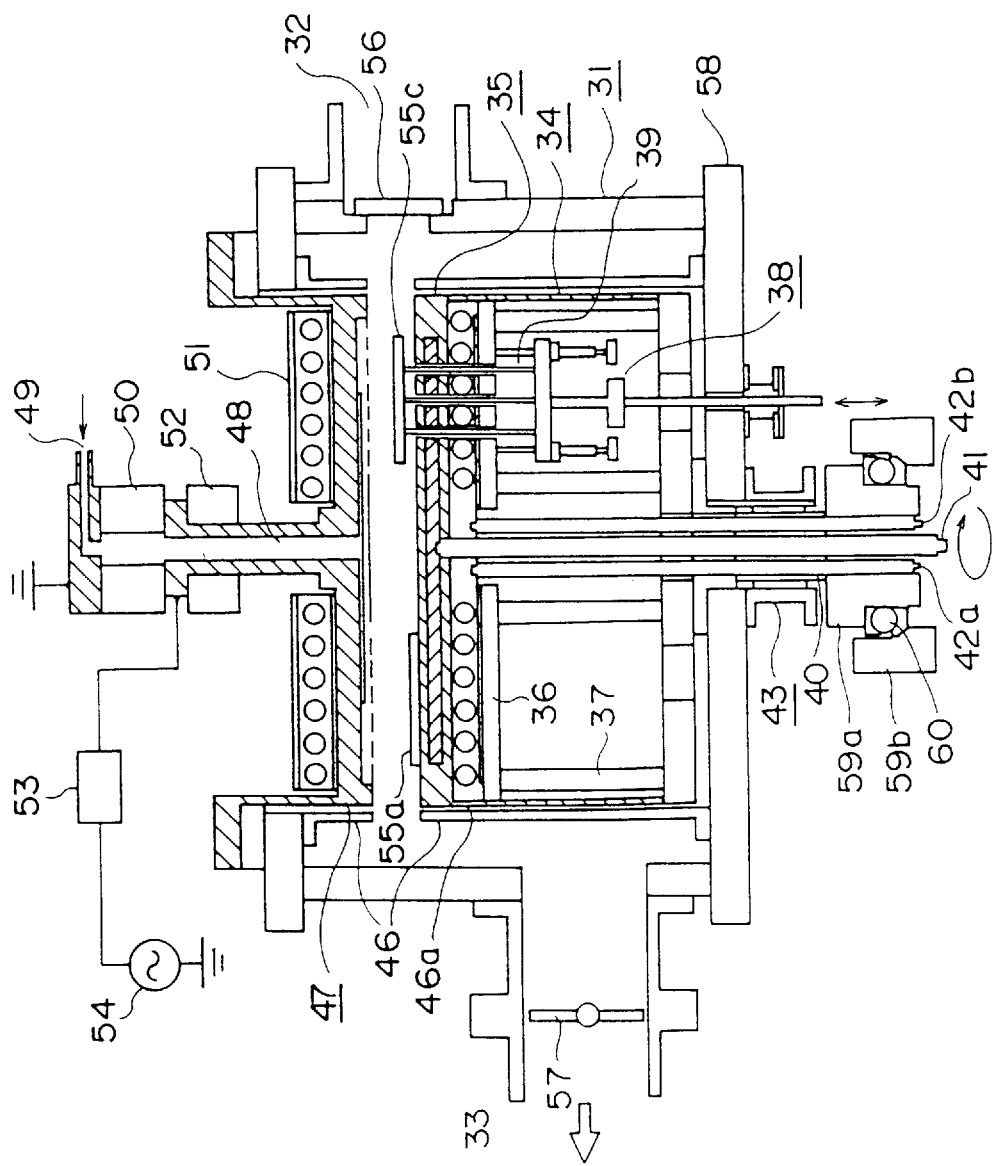
FIG. 10 is a side view showing an allover structure of a plasma CVD equipment according to a second embodiment of the present invention.

FIG. 10 is a side view showing a plasma CVD equipment according to a second embodiment of the present invention. The second embodiment is different from the first embodiment in that the rotation axis 40 fixed to the rotatable retainer 34 is supported at an outside of the process chamber 31.

More particularly, the shielding plates 44 which suppress flow of the reaction gas between the lower surface of the bottom wall 34b of the rotatable retainer 34, and the ball bearing 45 which supports the rotatable retainer 34 are removed from the first embodiment in FIG. 4. Instead, as shown in FIG. 10, the rotation axis 40 is rotatably supported by the ball bearing 60 at the outside of the process chamber 31 below the base 58. In FIG. 10, a reference 59a denotes a bearing holder fixed to the rotation axis 40, and a reference 59b denotes a bearing holder fixed to another location which is different from the external device of the process chamber 31.

Accordingly, it can be prevented that dust generated by wear of the ball bearing 45 at the supporting portion of the rotation axis 40 adversely affects an inside of the equipment.

Third Embodiment

Figure 11:
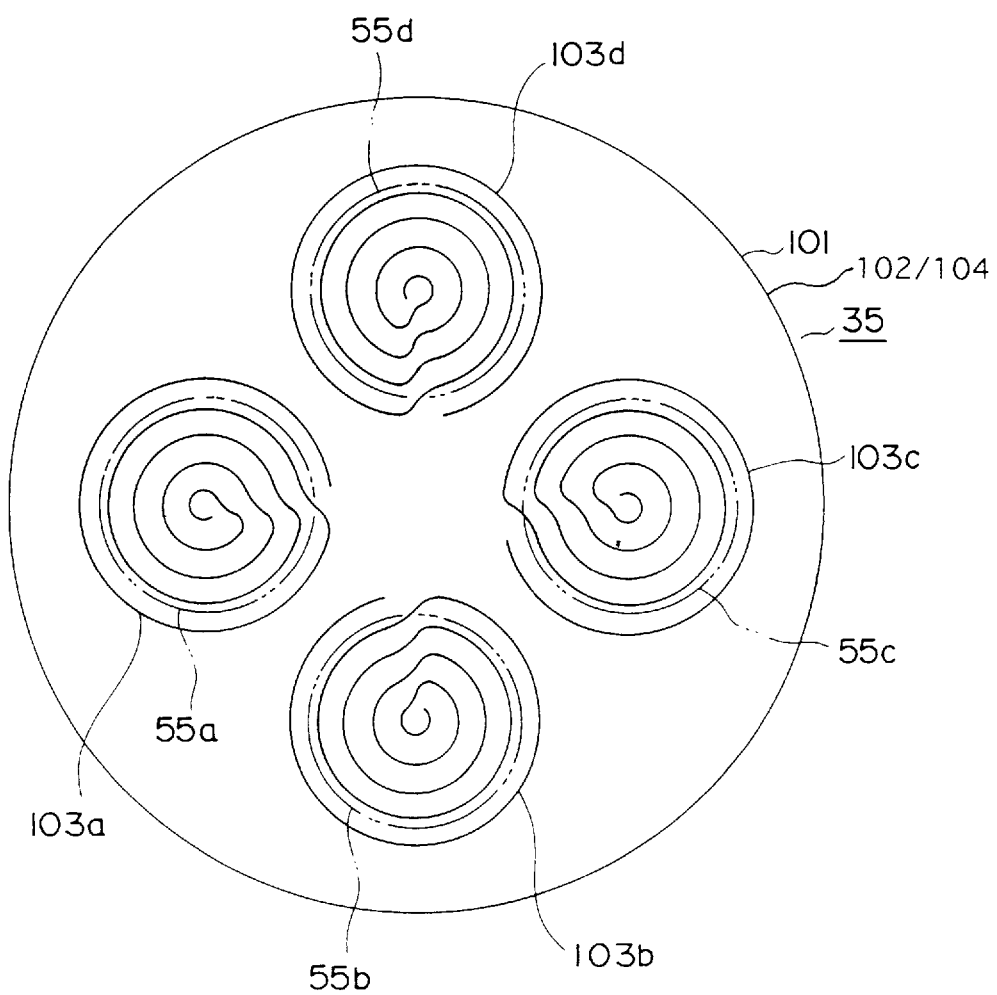
FIG. 11 is a plan view showing a wafer loading table in a plasma CVD equipment according to a third embodiment of the present invention in detail.

FIG. 11 is a top view showing a wafer loading table in a plasma CVD equipment according to a third embodiment of the present invention. The third embodiment differs from the first embodiment in that heaters 103a to 103d are provided independently to respective loading portions for loading the wafers 55a to 55d thereon.

Therefore, respective wafers 55a to 55d can be heated separately and independently. Even if thermal conductivity of the wafers 55a to 55d on respective wafer loading portions is different, or even if heating value by the single heater becomes different on respective wafers 55a to 55d, temperature of respective wafers 55a to 55d can be made uniform by adjusting heating values by respective heaters 103a to 103d independently.

Fourth Embodiment

Figure 12A:
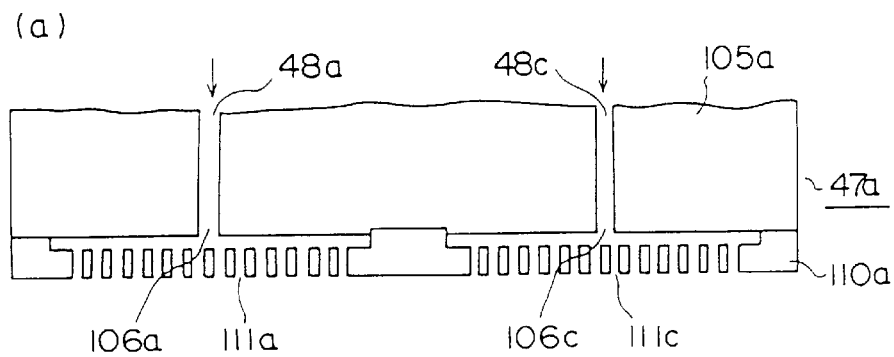
FIG. 12A is a sectional view showing a gas discharging device in a plasma CVD equipment according to a fourth embodiment of the present invention in detail.
Figure 12B:
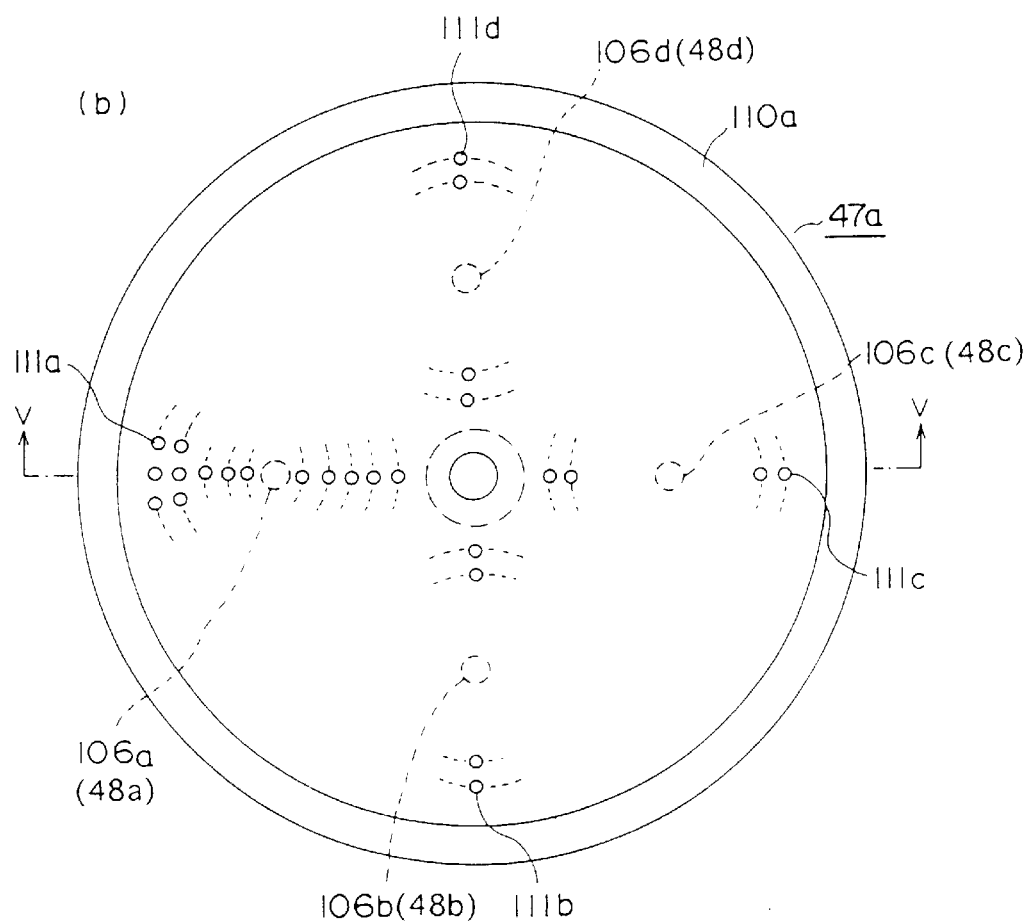
FIG. 12B is a bottom view showing the gas discharging device in FIG. 12A, where a sectional shape in FIG. 12A corresponds to that viewed from a line V—V in FIG. 12B.

FIG. 12A is a sectional view showing a gas discharging device in a plasma processing equipment according to a fourth embodiment of the present invention. FIG. 12B is a bottom view showing the gas discharging device in FIG. 12A. FIG. 12A corresponds to a sectional shape viewed from a line V—V in FIG. 12B. Unlike the first embodiment, four gas discharging portions for supplying the reaction gas independently are provided in the gas discharging device 47a in the fourth embodiment. In FIGS. 12A and 12B, references 48a to 48d denote a plurality of gas flow paths which permit the reaction gas to be flown independently and are connected independently to a plurality of gas introducing ports in the gas discharging device 47a. References 106a to 106d denote blowing ports of the plurality of gas flow paths 48a to 48d formed in the recess portion of the base body 105a. References 111a to 111d denote a plurality of gas discharging holes formed in a gas discharging plate 110a of respective gas discharging portions.

Accordingly, even when lengths, inner diameters, etc. of the gas flow paths become different locally due to variation in manufacturing the gas discharging device 47a, it is feasible to make amounts of the reaction gas discharged from respective gas discharging portions uniform by adjusting flow amounts of the reaction gas introduced from respective gas introducing ports in the gas discharging device 47a. Thereby, a multi-layer of different sorts of films with uniform thickness and homogeneous quality can be formed on the wafers, or those films can be uniformly etched.

In this case, since opposing electrodes are formed of a single electrode respectively, only one high frequency power supply may be utilized so that the equipment can be prevented from increasing in size. The above structure make possible shift of the wafers and continuous film formation while keeping the wafers at a predetermined temperature. Consequently, variation in film forming conditions or etching conditions is not caused. With this, once temperature of the wafers has been set to predetermined temperature and gas flow, etc. are set, there is no necessity of readjusting such values until the film formation has been finished. Therefore, precision of film forming conditions or etching conditions can be improved.

Fifth Embodiment

Figure 13A:
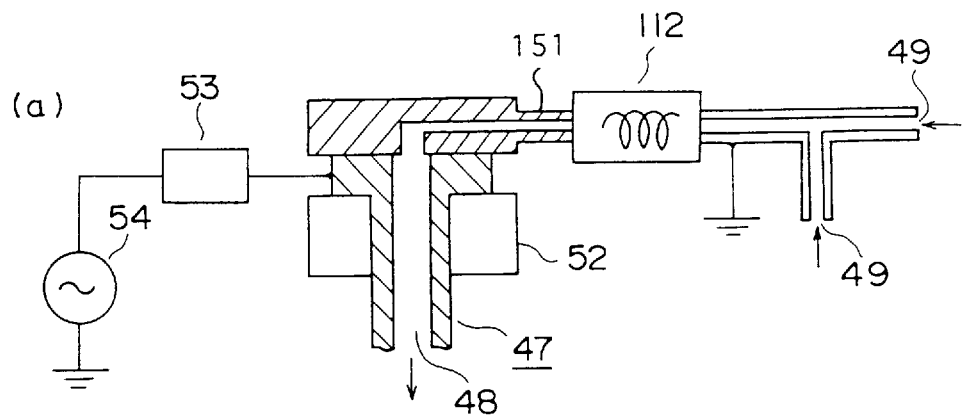
FIG. 13A is a side view showing gas pipings of a gas discharging device in a plasma CVD equipment according to a fifth embodiment of the present invention in detail.
Figure 13B:
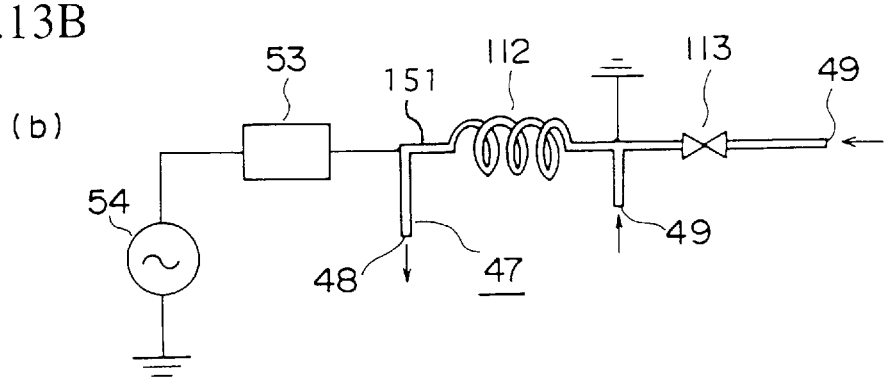
FIG. 13B is a side view schematically showing the gas pipings of the gas discharging device in FIG. 13A.

FIG. 13A is a side view showing gas pipings 112, 151 connected to the gas discharging device 47 in a plasma processing equipment according to a fifth embodiment of the present invention. FIG. 13B is a side view schematically showing the gas pipings of the gas discharging device 47 in FIG. 13A. The fifth embodiment is different from the first embodiment shown in FIGS. 4 and 7 in that the gas pipings 112, 151 are formed by conductive material without use of the insulator 50 and then the gas piping 112 which is positioned upstream from the connected portion of the high frequency power supply 54 is formed like a coil-like shape. Incidentally, FIG. 7 is a simplified side view showing gas piping connected to the gas discharging device 47 in FIG. 4.

The gas piping 112 formed as a coil-like shape has a function to cut off conduction of high frequency power. Hence, as shown in FIGS. 4 and 7, unless the insulating material 50 is interposed as a part of the gas piping upstream from the connected portion of the high frequency power supply 54, the high frequency power can be prevented from passing through to the gas introducing port 49 side when high frequency power is supplied from the high frequency power supply 54.

As with a particular example of the coil formed in the gas piping 112, its impedance will be calculated hereinbelow. In particular, assuming that a frequency of the high frequency power supply 54 is 13.56 MHz, an inner diameter of the coil is 50 mm, a number of turns is 4.5 turn, and a length is 40 mm, the impedance of the coil can be given as about 110 $\Omega$. At that time, since resistance of plasma can be estimated less than 1 $\Omega$ at the same frequency as above, high frequency power is not passed through to the gas introducing port 49 side of the gas pipings, but most of high frequency power can be supplied to the gas distributing device 47 side.

In the above embodiments, the gas distributing devices 47, 47a have been fixed while the wafer loading table 35 has been rotated. Conversely, similar advantages to those achieved in the above embodiments can be attained if the wafer loading table 35 is fixed while the gas distributing devices 47, 47a are rotated.

As discussed earlier, in the plasma processing equipment of the present invention, a wafer loading table for loading a plurality of substrates thereon can be rotated and shifted relative to the gas discharging device. Therefore, even if flow of the reaction gas from the gas discharging device is deviated locally, supply of the reaction gas to the substrates can be made uniform by rotating the gas discharging device along one direction or both directions during forming the film or etching the film. Thereby, the film with uniform thickness and homogeneous quality can thus be formed on a plurality of substrates, or the film is uniformly etched.

Then, by forming both opposing electrodes as a single electrode respectively, only one high frequency power supply may be used in the equipment. In addition, by forming a heater to be formed in the loading table as a single heater, only one power supply may be used to supply power to the heater in the equipment. Thus, increase in size of the equipment can be suppressed.

Further, when a reaction gas is plasmanized upon applying a high frequency power between the first electrode and the second electrode, the rotation of the loading table relative to the gas discharging device makes the plasma strength to all substrates uniform to result in formation of films with uniform thickness and homogeneous quality.

In addition, a single gas discharging device having a gas introducing port in its central portion may be used, and an annular gas discharging portion may be formed to oppose to a plurality of substrates arranged along a circumference of the wafer loading table in the gas discharging device. In addition, a narrow gas flow path for connecting the gas discharging portion with the gas introducing port is provided in the gas discharging device. Therefore, since spreading out of the reaction gas can be suppressed, supply of the reaction gas to the gas discharging portion can be equalized.

Moreover, since the reaction gas can be supplied substantially directly on the substrates from these gas discharging portions, a supply amount of the reaction gas to respective substrates can be made uniform much more.

In addition, since the wafer loading table is equipped with a heater, the loading table can be rotated and shifted while holding the substrates at a predetermined temperature. Further, since plural heaters are provided to plural loading portions of the wafer loading table individually, uniformity of the temperature of the substrates placed on respective loading portions can be achieved by adjusting respective heating values of respective heaters.

Furthermore, if the reaction gases are switched after formation or etching of one film has been finished, shift of the substrates and continuous formation or etching of different kinds of films can be carried out while keeping the substrates at a predetermined temperature. Thus, higher throughput can be accomplished while different kinds of films with uniform thickness and homogeneous quality can be formed, or different kinds of films can be etched uniformly. In the gas discharging device of the present invention, there are provided a through-hole (a first gas flow path) formed at the central portion of the base body, a space (a second gas flow path) formed between the distributing plate for distributing in a radial direction a reaction gas introduced from the through-hole and the base body and between the distributing plate and the annular gas discharging plate, and gas discharging holes for discharging the gas carried through the space serving as the second gas flow path.

Accordingly, since the gas passed through the first gas flow path is then fed to the gas discharging holes through the second gas flow path not to spread unnecessarily, supply of the gas to the gas discharging holes can be equalized. In addition, since the gas distributing plate is provided to spread the gas supplied from the first gas flow path in the radial direction, the gas in a widely spread state previously can be discharged. As a result, a gas amount supplied to a peripheral portion can be made more uniform.

Then, in the plasma processing equipment of the present invention, there are provided the gas discharging device described above, and a loading table for loading a plurality of substrates to oppose to the annular gas discharging member. Hence, the reaction gas can be discharged to respective center areas of the substrates from the gas discharging member. With this, gas supply amount to respective substrates can be equalized and supressed in deviation on the surface of the substrate. Thereby, a film with uniform thickness and homogeneous quality can be formed on a plurality of substrates or films can be uniformly etched.

Further, even if gas supply from the gas discharging device is deviated locally, or even if gas flow is deviated because of structural asymmetry of the gas discharging device, supply of the reaction gas can be made uniform by rotating the gas discharging device along the annular region in the course of forming or etching the film. The film with uniform thickness and homogeneous quality can thus be formed on plural substrats or films can be etched uniformly.

Still further, when the high frequency power for plasmanizing the gas is supplied to the gas discharging plate through the base body, by contacting the gas discharging member and the base body of the gas discharging device at not only a peripheral portion but also a central portion of the base body, potential difference between the base body and the gas discharging member can be reduced much more to prevent electric discharge between the base body and the gas discharging member.

Furthermore, by connecting an AC power supply for applying a bias voltage to the substrates to an electrode of the loading table, it is capable of collecting active particles (ions) by virtue of attractive force generated by an electric field, and thus enhancing film forming rate and etching rate and also forming a more densified film.

Moreover, by serving the gas discharging device and the loading table as opposing single electrodes (first and second electrodes) respectively, only one high frequency power supply may be used. Correspondingly, increase in size of the equipment can be suppressed.

Various modifications will become possible for those skilled in the art after receiving the teachings of the present disclosure without departing from the scope thereof.

What is claimed is:

1. A plasma processing equipment comprising:
   (a) a gas discharging device for discharging a reaction gas, serving as a first electrode;
   (b) a table which rotates while facing said gas discharging device, having (1) loading portions on which substrates to be processed are loaded annularly, and (2) a single conductive plate provided under said loading portions, and serving as a second electrode in common to said substrates loaded on said loading portions; and c) a high frequency power supply for applying power to plasmanize said reaction gas, being connected to one of said first electrode and said second electrode.

2. A plasma processing equipment according to claim 1, further comprising an AC power supply for applying a bias voltage to said substrates which are loaded on said table, being connected to said second electrode.

3. A plasma processing equipment according to claim 1, wherein said table has a single heater which is provided under said loading portions and in common to said substrates loaded on said loading portions.

4. A plasma processing equipment according to claim 3, wherein said single conductive plate and said single heater are buried in said table.

5. A plasma processing equipment according to claim 4, wherein said conductive plate and said heater are insulated each other by said insulating material interposed therebetween.

6. A plasma processing equipment according to claim 1, further including a plurality of heaters which are separately buried in said table and at locations corresponding to said loading portions.

7. A plasma processing equipment according to claim 6, wherein said conductive plate is buried in said table, and said conductive plate and said plurality of heaters are insulated each other by said insulating material interposed therebetween.

8. A plasma processing equipment according to claim 1, wherein said gas discharging device has a gas introducing port for introducing said reaction gas and a gas discharging port which opposes to said loading portions of said table, and is further provided with a conductive gas piping which links said gas introducing port to said gas discharging port and has a coil-like piping portion partially.

9. A plasma processing equipment according to claim 1, further comprising, a process chamber where said gas discharging device and said table are received and pressure can be reduced, and a rotating axis which is fixed to said table, extends to an outside of said process chamber, and is supported rotatably at said outside of said plasma processing equipment.

10. A plasma processing equipment according to claim 1, wherein said gas discharging device further includes, a gas introducing port for introducing said reaction gas, an annular gas discharging port which is arranged so as to oppose to said loading portions of said table, and a gas flow path which links said annular gas discharging port to said gas introducing port.

11. A plasma processing equipment according to claim 10, wherein said annular gas discharging port has a plurality of gas discharging holes.

12. A plasma processing equipment according to claim 1, wherein said gas discharging device further includes, a plurality of gas introducing ports which are separated each other, a plurality of gas discharging ports which are arranged annularly so as to oppose to said loading portions of said table, and a plurality of gas flow paths which are separated each other and link said respective gas discharging ports to said respective gas introducing ports.

13. A plasma processing equipment according to claim 12, each of said gas discharging ports has a plurality of gas discharging holes.

14. A gas discharging device serving as a first electrode in a plasma processing equipment, comprising:

(a) a gas introducing port;

(b) a first gas flow path for introducing a gas into a central portion of said gas discharging device, being linked to said gas introducing port;

(c) a second gas flow path being connected to said first gas flow path, splitting said gas in a radial direction at said central portion, and then resplitting said once split gas toward said central portion and an peripheral portion of said gas discharging device in an intermediate portion between said central portion and said peripheral portion; and (d) an annular gas discharging port for discharging said resplit gas, being connected to said second gas flow path.

15. A gas discharging device comprising:

(a) a base body having a gas introducing port, a recess portion at the central portion of the base body and a first gas flow path which links said gas introducing port to said recess portion;

(b) a gas distributing plate provided in said recess portion, forming a first space to serve as a radial outward part of a second gas flow path between said base body and said gas distributing plate; and (c) an annular gas discharging member for discharging said gas, forming a second space to serve as a split radial inward and outward part of said second gas flow path between said gas distributing plate and said annular gas discharging member.

16. A gas discharging device according to claim 15, wherein said annular gas discharging member contacts said base body at its outer peripheral portion and also contacts said base body at its inner peripheral portion via said gas distributing plate.

17. A gas discharging device according to claim 15, wherein said annular gas discharging member has a plurality of gas discharging holes which are distributed in an annular region.

18. A plasma processing equipment comprising:

(a) a gas discharging device provided with, (1) a base body having a gas introducing port, a recess portion at a central portion of the base body and a first gas flow path which links said gas introducing port to said recess portion, (2) a gas distributing plate provided in said recess portion, forming a first space to serve as a radial outward part of a second gas flow path between said base body and said gas distributing plate, and (3) an annular gas discharging member for discharging said gas, forming a second space to serve as a split radial inward and outward part of said second gas flow path between said gas distributing plate and said annular gas discharging member; and (b) a table serving as a second electrode, and having a plurality of loading portions for loading substrates to be processed, and said loading portions being arranged to oppose to said annular gas discharging member.

19. A plasma processing equipment according to claim 18, wherein said annular gas discharging member of said gas discharging device contacts said base body at its outer peripheral portion and also contacts said base body at its inner peripheral portion via said gas distributing plate.

20. A plasma processing equipment according to claim 18, wherein said annular gas discharging member of said gas discharging device has a plurality of gas discharging holes which are arranged in a side facing to said loading portions of said table.

21. a plasma processing equipment according to claim 18, further comprising rotating means for rotating said table to pass the substrates along an annular direction juxtaposed with said annular gas discharging device.

22. A plasma processing equipment according to claim 18, further comprising a high frequency power supply connected to said gas discharging device to plasmanize said gas.

23. A plasma processing equipment according to claim 18, further comprising an AC power supply connected to said table to apply a bias voltage to said substrates which are loaded on said table.

* * * * *

UNITED STATES PATENT AND TRADEMARK OFFICE
CERTIFICATE OF CORRECTION

PATENT NO. : 5,834,730
DATED : November 10, 1998
INVENTOR(S) : SUZUKI et al

It is certified that error appears in the above-indentified patent and that said Letters Patent is hereby corrected as shown below:

```
Col. 5,  line 20, delete "be" insert --been--; and
         line 62, delete "an" insert --a--.
Col. 6,  line 28, "devicei s" should read --device is--;
         line 34, "substrats" should read --substrates--.
Col. 8,  line 53, "connected," should read --connected--.
Col. 11, line 43, delete "an" insert --a--.
Col. 12, line 66, delete "with" insert --while--
Col. 13, line 44, do not begin a new paragraph with "In".
Col. 15, line 1,  delete "an" insert --a--;
         line 39, delete "an" insert --the--.
Col. 18, line 24, "supressed" should read --suppressed--; and
         line 36, "substrats" should read --substrates--.
Col. 19, line 67, before "each" insert --from--.
Col. 20, line 4,  before "each" insert --from--;
         line 7,  delete "12" and insert --14--;
         line 19, delete "an" insert --a--; and
         line 58, before "forming" insert --and--.
```

UNITED STATES PATENT AND TRADEMARK OFFICE
CERTIFICATE OF CORRECTION

PATENT NO. : 5,834,730
DATED : November 10, 1998
INVENTOR(S) : SUZUKI et al

It is certified that error appears in the above-indentified patent and that said Letters Patent is hereby corrected as shown below:

Col. 12, line 66, do not begin a new paragraph with "Thereby".

Signed and Sealed this

Twenty-sixth Day of October, 1999

Attest:

Q. TODD DICKINSON

*Attesting Officer*  *Acting Commissioner of Patents and Trademarks*